United States Patent
Huang et al.

(10) Patent No.: US 9,716,169 B2
(45) Date of Patent: Jul. 25, 2017

(54) LATERAL DOUBLE DIFFUSED METAL OXIDE SEMICONDUCTOR FIELD-EFFECT TRANSISTOR

(71) Applicant: CSMC TECHNOLOGIES FAB1 CO., LTD., Jiangsu (CN)

(72) Inventors: Feng Huang, Jiangsu (CN); Guipeng Sun, Jiangsu (CN); Guangtao Han, Jiangsu (CN)

(73) Assignee: CSMC TECHNOLOGIES FAB1 CO., LTD., Jiangsu (CN)

( * ) Notice: Subject to any disclaimer, the term of this patent is extended or adjusted under 35 U.S.C. 154(b) by 0 days.

(21) Appl. No.: 14/902,261

(22) PCT Filed: Aug. 15, 2014

(86) PCT No.: PCT/CN2014/084545
§ 371 (c)(1),
(2) Date: Dec. 30, 2015

(87) PCT Pub. No.: WO2015/021944
PCT Pub. Date: Feb. 19, 2015

(65) Prior Publication Data
US 2016/0372591 A1    Dec. 22, 2016

(30) Foreign Application Priority Data
Aug. 15, 2013    (CN) .......................... 2013 1 0358585

(51) Int. Cl.
*H01L 29/66* (2006.01)
*H01L 29/78* (2006.01)
(Continued)

(52) U.S. Cl.
CPC ...... *H01L 29/7816* (2013.01); *H01L 29/0649* (2013.01); *H01L 29/0653* (2013.01);
(Continued)

(58) Field of Classification Search
CPC ................................................... H01L 29/7816
(Continued)

(56) References Cited

U.S. PATENT DOCUMENTS

2009/0256199 A1    10/2009    Denison et al.
2009/0294849 A1    12/2009    Min et al.
(Continued)

FOREIGN PATENT DOCUMENTS

CN    101877315 A    11/2010
CN    102074578 A    5/2011
(Continued)

OTHER PUBLICATIONS

International Search Report, PCT/CN2014/084545.
(Continued)

*Primary Examiner* — Jami M Valentine
(74) *Attorney, Agent, or Firm* — Polsinelli PC

(57) ABSTRACT

A lateral double diffused metal oxide semiconductor field-effect transistor includes semiconductor substrates, body regions positioned in the semiconductor substrates, drift regions positioned in the semiconductor substrates, source regions and a body leading-out region which are positioned in the body regions and spaced from the drift regions, a field region and drain regions which are positioned in the drift regions, and gates positioned on the surfaces of the semiconductor substrates to partially cover the body regions, the drift regions and the field region, wherein the field region is of a finger-like structure and comprises a plurality of strip field regions which extend from the source regions to the drain regions and are isolated by the active regions; and the strip field regions provided with strip gate extending regions extending from the gates.

10 Claims, 3 Drawing Sheets

(51) Int. Cl.
*H01L 29/423* (2006.01)
*H01L 29/06* (2006.01)
*H01L 29/08* (2006.01)
*H01L 29/10* (2006.01)
*H01L 29/40* (2006.01)

(52) U.S. Cl.
CPC ...... *H01L 29/0865* (2013.01); *H01L 29/0882* (2013.01); *H01L 29/1095* (2013.01); *H01L 29/4238* (2013.01); *H01L 29/66659* (2013.01); *H01L 29/7835* (2013.01); *H01L 29/1045* (2013.01); *H01L 29/402* (2013.01)

(58) Field of Classification Search
USPC .......................................... 257/343
See application file for complete search history.

(56) References Cited

U.S. PATENT DOCUMENTS

| 2010/0003797 | A1 | 1/2010 | Smith | |
| 2011/0215402 | A1* | 9/2011 | Lee | H01L 29/063 257/335 |
| 2013/0341717 | A1* | 12/2013 | Chen | H01L 29/66659 257/337 |
| 2014/0332901 | A1* | 11/2014 | Yang | H01L 29/7833 257/401 |
| 2015/0076555 | A1* | 3/2015 | Yang | H01L 21/76229 257/141 |
| 2015/0333170 | A1* | 11/2015 | Li | H01L 29/405 257/329 |

FOREIGN PATENT DOCUMENTS

| CN | 202205754 U | 4/2012 |
| CN | 103022125 A | 4/2013 |
| CN | 103050540 A | 4/2013 |

OTHER PUBLICATIONS

International Search Report dated Nov. 18, 2014 issued in the counterpart International Application No. PCT/CN2014/084545.
Chinese Office Action dated Sep. 18, 2016 issued in the counterpart Chinese Application No. 201310358585.X.

* cited by examiner

LATERAL DOUBLE DIFFUSED METAL OXIDE SEMICONDUCTOR FIELD-EFFECT TRANSISTOR

CROSS REFERENCE TO RELATED APPLICATIONS

This application is a national stage application (under 35 U.S.C. §371) of PCT/CN2014/084545, filed Aug. 15, 2014, which claims priority to Chinese Application No. 201310358585.X, filed Aug. 15, 2013, the contents of which are incorporated herein by reference in its entirety.

FIELD OF THE INVENTION

The present disclosure relates to a technical field of LDMOS (Lateral Double Diffused MOSFET), and more particularly relates to a LDMOS device with a decreased Rdson.

BACKGROUND OF THE INVENTION

With the continuous development of semiconductor technology, lateral double diffused metal oxide semiconductor field effect transistor (LDMOS) devices have been widely used in mobile phones, specifically in cell phones, due to its excellent short channel characteristics. As mobile communication market (especially the cellular communication market) continues to increase, the manufacturing process of LDMOS devices become more increasingly mature. As a power switching device, LDMOS has such characteristics as a relatively high operating voltage, simple process, easy to be compatible in the process with low-voltage CMOS circuit. During operation, LDMOS includes an "off-state" and an "on-state". Compared with common MOS device, LDMOS has a lightly doped implanting region at the source and the drain, which is known as a drift region. Since it is generally used in power circuits requiring a large output power, and LDMOS must be able to withstand high voltages. With the wild applications of LDMOS in the power integrated circuits, the performance requirements for LDMOS device are also increasing, which requires a higher off-state breakdown voltage (off-BV) with a smaller on-resistance (Rdson). In conclusion, there are more urgent demand for LDMOS devices with a higher off-BV and a smaller Rdson.

FIG. 1 illustrates a sectional view of an LDMOS device manufactured according to a conventional method. Referring to FIG. 1, the LDMOS includes a substrate 100, an active region formed in the substrate, a well 101 formed in the substrate, a field oxide layer 102 positioned on the surface junction of substrate 100 and the well 102, a drift region 108 positioned in the semiconductor substrate 100, a drift region field oxide layer 103 covering the drift region 108, a body leading-out region 104 positioned in the well region 101, a source region 105 positioned in the well region 101, a drain region 106 positioned in the drift region 108, a gate structure 107 positioned on the substrate 100. The source, drain, and gate can be led out from the source region, a drain region and the gate respectively by patterning. The gate structure 107 can partially extend to the drift region field oxide layer 103 of the drift region 108. FIG. 2 is a top view of an LDMOS device manufactured according to a conventional method. The LDMOS device includes a source 200, a gate 201, a drain 202, and a drift region. The entire drift region is a field oxide layer 203, which is adjacent to the drain 202. Part of the gate 201 is positioned on the field oxide layer 203 of the drift region. In the prior art, in order to obtain a less Rdson, the concentration of the drift region must be high, however, the higher concentration may result in lower off-state breakdown voltage.

Therefore, there is a need to provide a lateral double diffused metal oxide semiconductor field-effect transistor which can decrease the Rdson while obtaining a higher off-state breakdown voltage value.

SUMMARY OF THE INVENTION

The present invention will become more fully understood from the detailed description given herein below and the accompanying drawings which are given by way of illustration only, and thus are not limitative of the present invention.

Accordingly, it is necessary to provide a lateral double diffused metal oxide semiconductor field-effect transistor which can decrease the Rdson while obtaining a higher off-state breakdown voltage value.

A lateral double diffused metal oxide semiconductor field-effect transistor includes: a semiconductor substrate; a body region positioned in the semiconductor substrate; a drift region positioned in the semiconductor substrate; a source region and a body leading-out region positioned in the body region and spaced from the drift region; a field region and a drain region positioned in the drift region; and a gate positioned on the semiconductor substrate and covering partial the body region, the drift region, and the field region; wherein the field region is a finger-like structure and comprises a plurality of strip-like field regions extending from the source region to the drain region, and the plurality of strip-like field regions are isolated by an active region.

In one embodiment, the gate comprises a plate-like portion adjacent to the source region and a plurality of strip-like portions positioned on the strip-like field regions.

In one embodiment, the plurality of strip-like portions of the gate extends from the plate-like portion of the gate to the strip-like field regions.

In one embodiment, a width of the strip-like portion of the gate is less than a width of the strip-like field region.

In one embodiment, the strip-like portions of the gate deplete the drift region.

In one embodiment, the field region is a STI or FOX.

In the aforementioned LDMOS, the entire drift region is depleted by using the strip-like gate on the strip-like field region, thus a higher off-state breakdown voltage value is achieved. Since the plurality of active regions can increase the concentration of the impurities of the drift region, the Rdson is decreased.

BRIEF DESCRIPTION OF THE DRAWINGS

The components in the drawings are not necessarily drawn to scale, the emphasis instead being placed upon clearly illustrating the principles of the present disclosure.

DETAILED DESCRIPTION OF THE EMBODIMENTS

The following description provides specific details for a thorough understanding of the various embodiments and for the enablement of one skilled in the art. However, one skilled in the art will understand that the invention may be practiced without such details. In some instances, well-known structures and functions have not been shown or described in detail to avoid unnecessarily obscuring the description of the embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

As used herein, the following directional terms "forward", "rearward", "left", "right", "upward" and "downward" as well as any other similar directional terms refer to those directions which are determined on the basis of the LDMOS shown in figures, for instance, the lateral direction refers to a channel direction of the LDMOS, which is parallel to the substrate surface, and the vertical direction is perpendicular to the substrate surface. Accordingly, it should be noted that these directional terms are relative concepts relatively used to describe and clarify, which can vary as long as the position of the LDMOS changes.

Figure 3:
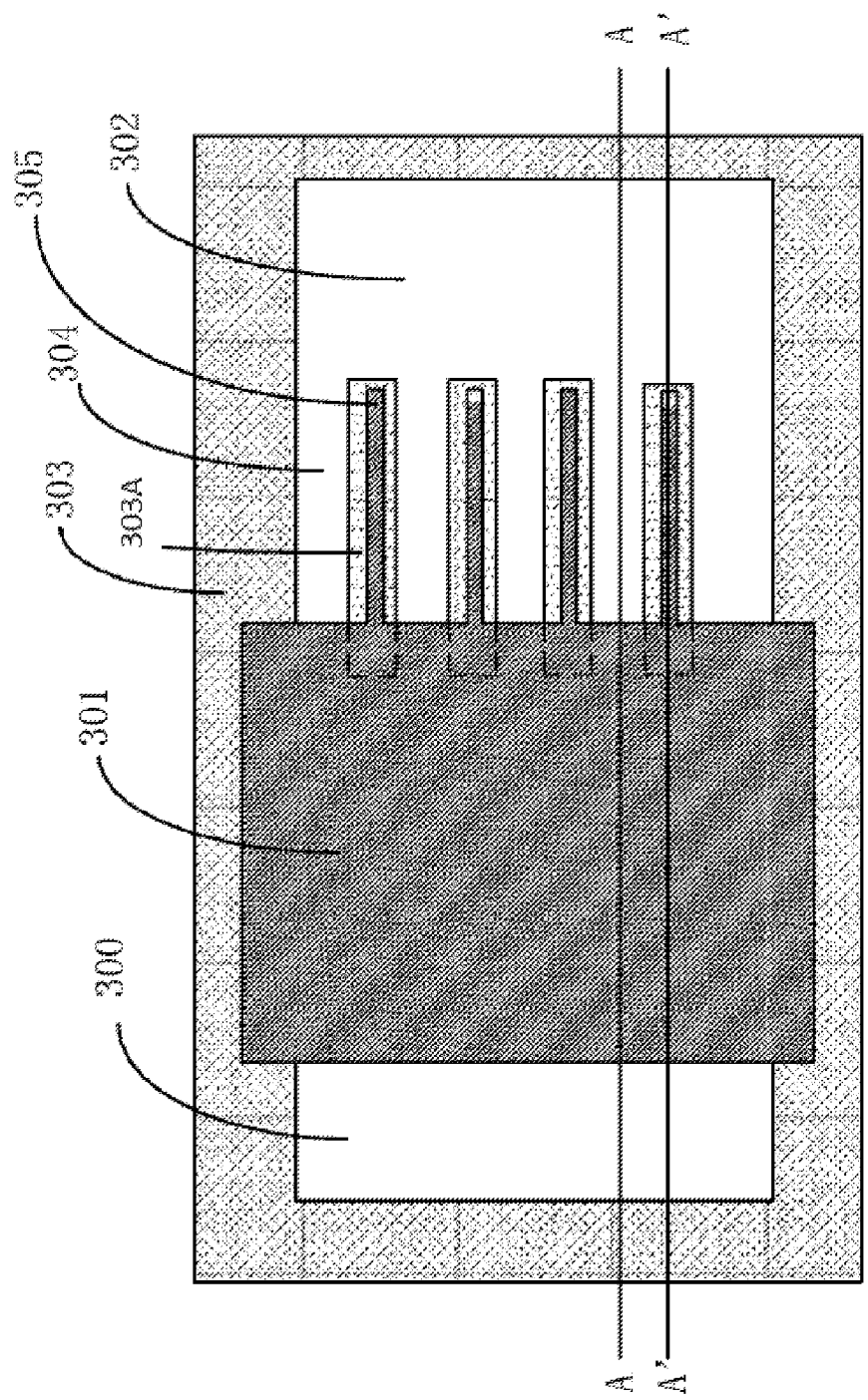
FIG. 3 is a top view of an LDMOS device manufactured according to an embodiment.
Figure 4:
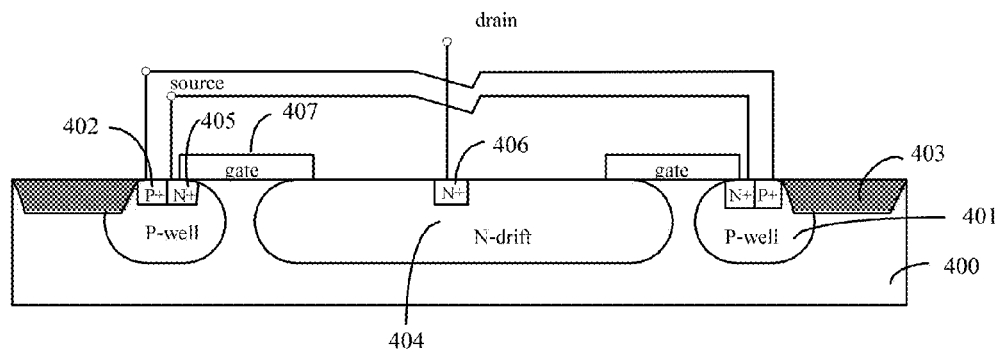
FIG. 4 is a sectional view of the LDMOS device taken from line A-A in FIG. 3.
Figure 5:
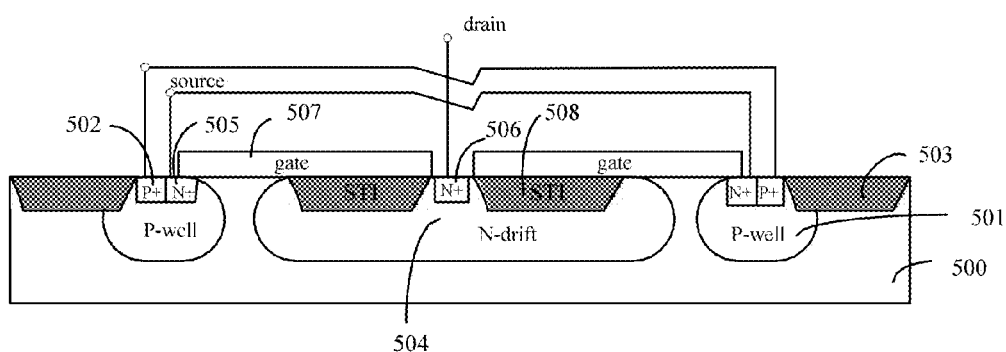
FIG. 5 is a sectional view of the LDMOS device taken from line A'-A' in FIG. 3.

In order to solve the problems in the prior art, the present invention provides a novel LDMOS semiconductor device structure. Embodiments of the invention are described more fully hereinafter with reference to the accompanying FIGS. 3 to 5, where FIG. 3 is a top view of an LDMOS device manufactured according to an embodiment; FIG. 4 is a sectional view taken from line A-A of the LDMOS device in FIG. 3; and FIG. 5 is a sectional view taken from line A'-A' of the LDMOS device in FIG. 3.

FIG. 3 is a top view of an LDMOS device manufactured according to an embodiment. In the illustrated embodiment, the lateral double diffused metal oxide semiconductor field-effect transistor is an N-type device. Reference will now be made to FIG. 3 to describe, in detail, embodiments of the present LDMOS structure.

The LDMOS device includes a source region 300, a gate 301, a drain region 302, and a drift region 304. A field region 303 and the drain region 302 are formed in the drift region. The gate 301 is formed on a semiconductor substrate and covers partial the body region, the drift region 304, and the field region 303. The gate 301 is preferably made of polysilicon. The field region 303 is a finger-like structure and includes a plurality of strip-like field regions 303A extending from the source region 300 to the drain region 302, and the plurality of strip-like field regions 303A are isolated by an active region 304. The gate 301 includes a plate-like portion adjacent to the source region 302 and a plurality of strip-like portions 305 positioned on the strip-like field regions. The plurality of strip-like portions 305 of the gate extends from the plate-like portion of the gate 301 to the strip-like field regions 303A. A width of the strip-like portion 305 of the gate 301 is less than a width of the strip-like field region 303A. The strip-like field regions 303A of the gate deplete the drift region.

Figure 1:
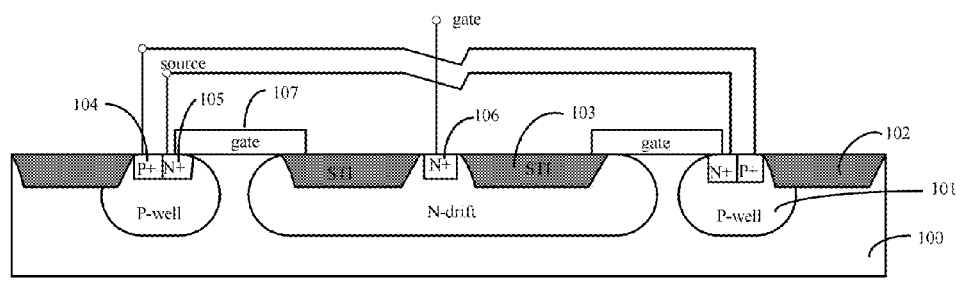
FIG. 1 is a sectional view of an LDMOS device manufactured according to a conventional method.
Figure 2:
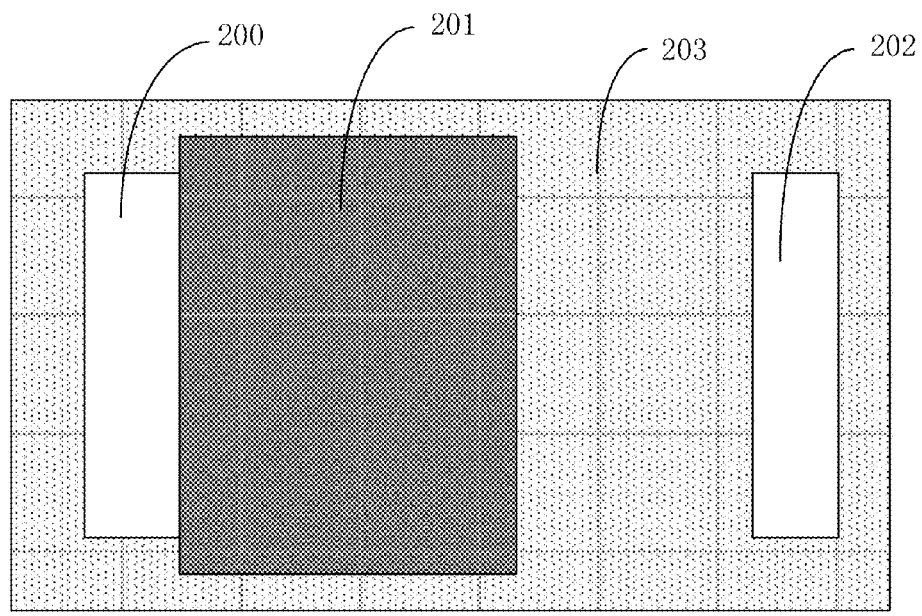
FIG. 2 is a top view of an LDMOS device manufactured according to a conventional method.

Taking an N-type device as an example, the present invention provides a lateral double diffused metal oxide semiconductor field-effect transistor which can on the one hand decrease the Rdson, while on the other hand obtain a higher off-state breakdown voltage value. Referring to FIG. 3, comparing to the top view of LDMOS shown in FIG. 2, the present invention provides a lateral double diffused metal oxide semiconductor field-effect transistor which can decrease the Rdson while obtaining a higher off-state breakdown voltage value by means of the layout of the LDMOS semiconductor device. In other words, the present invention transforms the field region of the drift region of the conventional LDMOS into a finger-like structure, which includes a plurality of strip-like field regions extending from the source region 300 to the drain region 301, and the plurality of strip-like field regions are isolated by the active region 304. The LDMOS includes a source 300, a gate 301, a source 302, and a field region and a drain region which are positioned in the drift region; a gate 301 positioned on a semiconductor substrate and covering partial the body region, the drift region 304, and the field region 303. The field region 303 is a finger-like structure and includes a plurality of strip-like field regions 303A extending from the source region 300 to the drain region 302, and the plurality of strip-like field regions 303A are isolated by an active region 304. The gate 301 includes a plate-like portion adjacent to the source region 302 and a plurality of strip-like portions 305 positioned on the strip-like field regions The plurality of strip-like portions 305 deplete the impurities below a field oxide layer (STI) and in the active region (TO) between the STI and STI, such that the entire drift region is depleted, and a higher off-state breakdown voltage value is achieved. Since the plurality of active regions can increase the impurity concentration in the entire drift region, the Rdson is decreased.

FIG. 4 is a sectional view of the LDMOS device taken from line A-A in FIG. 3, which includes a substrate 400, a well 401 in the substrate, and a field oxide layer 403 positioned at the surface junction of the substrate 400 and the well.

Referring to FIG. 4, the LDMOS is formed on the semiconductor substrate 400, which is a silicon substrate. The drift region 404 and the well 401 are formed in the substrate by doping.

In the illustrated embodiment, the substrate is a P-type substrate, which has a certain doping concentration without being limited thereto. The semiconductor substrate can be formed by epitaxial growth, or it can be a wafer substrate.

The P-well 401 is formed in the semiconductor substrate using a standard well implanting process. For example, the P-well can be formed by a high energy implantation process, or by a low energy implantation along with a high temperature thermal annealing process. A source region and a body leading-out region can be formed in the well. The forming method of the drift region is similar to that of the P-well, for example, it can be formed by a high energy implantation process, or by a low energy implantation along with a high temperature thermal annealing process.

The P-well 401 is formed on the semiconductor substrate 400 as a body region. In a preferred embodiment, a doping concentration of the body region may be in a range of from 1015 atoms/cm$^3$ to 1018 atoms/cm$^3$, e.g. 1017 atoms/cm$^3$. For the N-trench LDMOS, the drift region is N-type doped. The drift region 404 is formed in the semiconductor substrate 400 at the same time. The drift region is positioned in the semiconductor substrate and between the source and the drain. As a lightly doped region, the presence of the drift region can provide a breakdown voltage of the LDMOS device, while reducing the parasitic capacitance between the source and the drain. For the N-trench LDMOS, the drift region is N-type doped, and a doping concentration thereof is usually less than a doping concentration of the drain. In a preferred embodiment, a doping concentration of the drift region may be in a range of from 1015 atoms/cm$^3$ to 1018 atoms/cm$^3$.

Isolation region oxide layer 403 is formed on the semiconductor substrate 400 using a shallow trench isolation technique or thermal oxidation growth technology. The well region 401 and the drift region 404 are form in the semiconductor substrate 400. The source region 405 is formed in the well region, and the drain region 406 is formed in the drift region.

In a specific embodiment of the present invention, the well region is formed in the P-type substrate by implanting P-type impurities, and the source region 405 is formed in the well region by implanting N-type impurities. The body leading-out region 402 is formed by implanting P+ impurities into the well. The drift region 404 is formed in the semiconductor substrate 400 by implantation. The drain region 406 is formed by implanting N+ impurities into the drift region. In the illustrated embodiment, the source 405 and the drain 406 can be formed by N-type doping to the semiconductor substrate 400, and the doping concentrations of both the source 405 and the drain 406 can be the same, thus they can be synchronized formed by doping. In a preferred embodiment, the doping concentration of the source 405 and the drain 406 may be in a range of from 1018 atoms/cm$^3$ to 1021 atoms/cm$^3$, e.g. 1020 atoms/cm$^3$.

A gate structure 407 covering partial the body region and the drift region is formed on the surface of the semiconductor substrate 400.

Finally, an inter-layer dielectric layer (not shown) is deposited on the semiconductor substrate, and holes are formed on the inter-layer dielectric layer, metal is introduced to the holes, such that the gate, source, drain and body leading-out region are connected to the corresponding gate G, source S, drain D and Bulk.

FIG. 5 is a sectional view of the LDMOS device taken from line A'-A' in FIG. 3, which includes a substrate 500, a well 501 in the substrate, and a field oxide layer 503 positioned at the surface junction of the substrate 400 and the well.

Referring to FIG. 5, the LDMOS is formed on the semiconductor substrate 500, which is a silicon substrate. The drift region 504 and the well region 501 are formed in the substrate by doping.

In the illustrated embodiment, the substrate is a P-type substrate, which has a certain doping concentration without being limited thereto. The semiconductor substrate can be formed by epitaxial growth, or it can be a wafer substrate.

The P-well 501 is formed in the semiconductor substrate using a standard well implanting process. For example, the P-well can be formed by a high energy implantation process, or by a low energy implantation with a high temperature thermal annealing process. A source region and a body leading-out region can be formed in the well. The forming method of the drift region is similar to that of the P-well, for example, it can be formed by a high energy implantation process, or by a low energy implantation with a high temperature thermal annealing process.

The P-well 501 is formed on the semiconductor substrate 500 as a body region. In a preferred embodiment, a doping concentration of the body region may be in a range of from 1015 atoms/cm$^3$ to 1018 atoms/cm$^3$, e.g. 1017 atoms/cm$^3$. For the N-trench LDMOS, the drift region is N-type doped. The drift region 504 is formed in the semiconductor substrate 500 at the same time. The drift region is positioned in the semiconductor substrate and between the source and the drain. As a lightly doped region, the presence of the drift region can provide a breakdown voltage of the LDMOS device, while reducing the parasitic capacitance between the source and the drain. For the N-trench LDMOS, the drift region is N-type doped, and a doping concentration thereof is usually less than a doping concentration of the drain. In a preferred embodiment, a doping concentration of the drift region may be in a range of from 1015 atoms/cm$^3$ to 1018 atoms/cm$^3$. The subsequently formed drift region field oxide layer is the field region formed on the drift region, the field region is of a shallow trench isolation structure (STI).

In a specific embodiment of the present invention, a silicon nitride layer and a silicon oxide layer is formed on the semiconductor substrate, a photoresist with a drift region is used as a mask, and the trench is formed by sequentially etching the silicon nitride layer, the silicon oxide layer positioned on the drift region, and the silicon layer using dry etching. The photoresist with the drift region is removed, the silicon nitride layer outside the drift region is used a mask, a STI region 508 is formed by oxidation layer deposition and polishing, or a drift region field oxide layer (FOX) is formed on the semiconductor substrate by a thermal oxidation growth process.

An isolation region oxide layer 503 is formed on the semiconductor substrate 500 using a shallow trench isolation technology. The well region 501 and the drift region 504 are formed in the semiconductor substrate 500.

In a specific embodiment of the present invention, the well region 501 and the drift region 504 are formed in the semiconductor substrate 500 by implantation. The well region 501 and the drift region 504 can be formed by a high energy implantation process, or by a low energy implantation along with a high temperature thermal annealing process. The well region 501 is used as a body region, the body leading-out region 502 is formed by implanting P+ impurities into the body region, and the source region 505 is formed by implanting N+ impurities. The drain region 506 is formed by implanting N+ impurities into the drift region. The doping concentrations of both the source 505 and the drain 506 can be the same, thus they can be synchronized formed by doping. In a preferred embodiment, the N-type doping concentration of the source 505 and the drain 506 may be in a range of from 1018 atoms/cm$^3$ to 1021 atoms/cm$^3$, e.g. 1020 atoms/cm$^3$.

A gate structure 507 covering the drift region 504, the field region 508, and partial body region is formed on the surface of the semiconductor substrate 500.

Finally, an inter-layer dielectric layer (not shown) is deposited on the semiconductor substrate, holes are formed on the inter-layer dielectric layer, metal is introduced to the holes, such that the gate, source, drain and body leading-out region are connected to the corresponding gate G, source S, drain D and Bulk.

In the LDMOS semiconductor structure of the present invention, on the basis of the entire conventional drift region being the field region, a plurality of active regions are inserted, such that the whole drift region becomes a finger-like structure having a plurality of field regions and a plurality of source regions in a width direction. The N-type impurities of the active region below the field oxide layer (field region) and between the field oxide layers are depleted by the polysilicon flat plate, such that the whole drift region is depleted, thus a higher off-state breakdown voltage value is achieved. Since the plurality of active regions can increase the N-type impurities of the drift region, the drift region resistance is lowered, and the Rdson is decreased. The present invention does not increase any more difficult for the manufacturing process technology, and it can be well compatible with CMOS/LDMOS integrated circuit manufacturing processes.

Taking N-type device as an example, a manufacturing method of the lateral double diffused metal oxide semiconductor field-effect transistor can include the following steps:

In step a, a P-well is formed on a P-type substrate using a standard well implanting process.

In step b, a drift region is formed by implanting N-type impurities into the P-type substrate.

In step c, an active region is defined, and a field oxide layer is formed in the field region using a standard shallow trench isolation technique or thermal oxidation growth technology.

In step d, a gate is formed using a standard polysilicon deposition and etching process.

In step e, a body leading-out region is formed by implanting P+ impurities into the well region, and a source and a drain are formed by implanting N+ impurities into the well region and the drift region.

The step of depositing a dielectric layer, etching a contact hole, depositing a metal layer in the contact hole, etching the metal wires and passivation are well known to those skilled in the art, thus they will not be described in further details.

There is no difficulty in process section of manufacturing the lateral double diffused metal oxide semiconductor field-effect transistor according to the present invention, and it can be well compatible with CMOS/LDMOS integrated circuit manufacturing processes. The LDMOS device according to the present invention includes a source region, a gate, a drain region, and a drift region. A field region and the drain region are positioned in the drift region. The gate is formed on a semiconductor substrate and covers partial the body region, the drift region, and the field region. The gate is preferably made of polysilicon, but it can be made of metal or other semiconductor materials. The field region is a finger-like structure and includes a plurality of strip-like field regions extending from the source region to the drain region, and the plurality of strip-like field regions are isolated by an active region. The gate includes a plate-like portion adjacent to the source region and a plurality of strip-like portions positioned on the strip-like field regions.

Although the aforementioned embodiment uses NMOS as an example, it should be understood that, it can also be applied to PMOS by simple adjustment by the person skilled in the art.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A lateral double diffused metal oxide semiconductor field-effect transistor, comprising:
   a semiconductor substrate;
   a body region positioned in the semiconductor substrate;
   a drift region positioned in the semiconductor substrate;
   a source region and a body leading-out region positioned in the body region and spaced from the drift region;
   a field region and a drain region in the drift region; and
   a gate positioned on the semiconductor substrate and covering partial the body region, the drift region, and the field region;
   wherein the field region comprises a plurality of parallel spaced strip shaped field regions extending from the source region to the drain region, and the plurality of strip shaped field regions are isolated by an active region.

2. A lateral double diffused metal oxide semiconductor field-effect transistor, comprising:
   a semiconductor substrate;
   a body region positioned in the semiconductor substrate;
   a drift region positioned in the semiconductor substrate;
   a source region and a body leading-out region positioned in the body region and spaced from the drift region;
   a field region and a drain region in the drift region; and
   a gate positioned on the semiconductor substrate and covering partial the body region, the drift region, and the field region;
   wherein the field region is a plurality of parallel spaced strip shaped field regions extending from the source region to the drain region, and the plurality of strip shaped field regions are isolated by an active region;
   wherein the gate comprises a plate-like portion adjacent to the source region and a plurality of strip shaped portions positioned on the strip shaped field regions.

3. The lateral double diffused metal oxide semiconductor field-effect transistor according to claim 2, wherein the plurality of strip shaped portions of the gate extends from the plate-like portion of the gate to the strip shaped portion regions.

4. The lateral double diffused metal oxide semiconductor field-effect transistor according to claim 2, wherein a width of the strip shaped portion of the gate is less than a width of the strip shaped field region.

5. The lateral double diffused metal oxide semiconductor field-effect transistor according to claim 2, wherein the strip shaped portions of the gate deplete the drift region.

6. The lateral double diffused metal oxide semiconductor field-effect transistor according to claim 1, wherein the field region is a STI or FOX.

7. The lateral double diffused metal oxide semiconductor field-effect transistor according to claim 1, wherein the body region is a well region.

8. The lateral double diffused metal oxide semiconductor field-effect transistor according to claim 7, wherein the body leaning region is a portion of the well region implanted with additional impurities.

9. The lateral double diffused metal oxide semiconductor field-effect transistor according to claim 2, wherein the body region is a well region.

10. The lateral double diffused metal oxide semiconductor field-effect transistor according to claim 9, wherein the body leaning region is a portion of the well region implanted with additional impurities.

\* \* \* \* \*